(12) United States Patent
Okubo et al.

(10) Patent No.: US 11,798,749 B2
(45) Date of Patent: Oct. 24, 2023

(54) POWER CONVERTER INCLUDING FILTER CIRCUIT DEVICE TO IMPROVE A NOISE SUPPRESSION FUNCTION

(71) Applicant: HITACHI AUTOMOTIVE SYSTEMS, LTD., Hitachinaka (JP)

(72) Inventors: Yutaka Okubo, Hitachinaka (JP); Hiroki Funato, Tokyo (JP); Hiroyuki Yamai, Hitachinaka (JP); Taesung Kim, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 751 days.

(21) Appl. No.: 16/965,981

(22) PCT Filed: Dec. 26, 2018

(86) PCT No.: PCT/JP2018/047724
§ 371 (c)(1),
(2) Date: Jul. 29, 2020

(87) PCT Pub. No.: WO2019/150859
PCT Pub. Date: Aug. 8, 2019

(65) Prior Publication Data
US 2021/0036675 A1  Feb. 4, 2021

(30) Foreign Application Priority Data
Feb. 2, 2018  (JP) .................................. 2018-016876

(51) Int. Cl.
*H02M 7/00* (2006.01)
*H01F 27/24* (2006.01)
(Continued)

(52) U.S. Cl.
CPC ........... *H03H 7/0115* (2013.01); *H01F 27/24* (2013.01); *H01F 27/29* (2013.01); *H01F 27/40* (2013.01); *H02M 1/44* (2013.01); *H02M 7/003* (2013.01)

(58) Field of Classification Search
CPC ........ H02M 1/123; H02M 1/126; H02M 1/44; H01F 27/24; H01F 27/29; H01F 27/40; H03H 7/0115
See application file for complete search history.

(56) References Cited

U.S. PATENT DOCUMENTS 7,973,628 B1 *  7/2011  MacLennan .............. H01F 3/14
336/55
2015/0008989 A1 *  1/2015  Aizawa ................ H03H 7/0115
333/185
(Continued)

FOREIGN PATENT DOCUMENTS

CN  108231342 A *  6/2018 ........... H01F 17/062
DE  112013004481 T5 *  6/2015 .............. B60L 50/51
(Continued)

OTHER PUBLICATIONS

International Search Report and English Translation, PCT/JP2018/047724 dated Apr. 9, 2019, 4 pgs.

*Primary Examiner* — Sisay G Tiku
(74) *Attorney, Agent, or Firm* — Volpe Koenig

(57) ABSTRACT

A filter circuit device includes: first and second core members forming first and second through holes, respectively; a first conductor passing through the first and second through holes; a second conductor passing through the first and second through holes; a capacitor; a first terminal configured to electrically connect the first conductor with the capacitor; and a second terminal configured to electrically connect the second conductor with the capacitor. The first conductor from the first through hole to the second through hole and (Continued)

the second conductor from the first through hole to the second through hole have an opposing part between the first conductor and the second conductor. The first terminal presses an opposite surface of the first conductor, so as to be in contact with the first conductor. The second terminal presses an opposite surface of the second conductor, so as to be in contact with the second conductor.

7 Claims, 14 Drawing Sheets

(51) Int. Cl.
*H01F 27/29* (2006.01)
*H01F 27/40* (2006.01)
*H02M 1/44* (2007.01)
*H03H 7/01* (2006.01)

(56) References Cited

U.S. PATENT DOCUMENTS

| | | |
|---|---|---|
| 2015/0372655 A1 | 12/2015 | Beck |
| 2017/0149348 A1 | 5/2017 | Yanagimoto et al. |
| 2018/0183401 A1* | 6/2018 | Wang ...................... H01F 19/04 |
| 2018/0269781 A1* | 9/2018 | Amaducci ............ H05K 1/0233 |
| 2021/0273580 A1* | 9/2021 | Kim ...................... H02M 7/003 |
| 2023/0071172 A1* | 3/2023 | Fujiwara .................. H03H 7/01 |

FOREIGN PATENT DOCUMENTS

| | | | |
|---|---|---|---|
| JP | 2015-201957 A | | 11/2015 |
| JP | 2016-024939 A | | 2/2016 |
| JP | 2016-514387 A | | 5/2016 |
| JP | 2016514387 A | * | 5/2016 |
| JP | 2017-098384 A | | 6/2017 |
| JP | 2017-208943 A | | 11/2017 |
| JP | 2019169499 A | * | 10/2019 |
| JP | 7127317 B2 | * | 8/2022 |

* cited by examiner

POWER CONVERTER INCLUDING FILTER CIRCUIT DEVICE TO IMPROVE A NOISE SUPPRESSION FUNCTION

TECHNICAL FIELD

The present invention relates to a filter circuit device, and a power converter including the filter circuit device. More particularly, the present invention relates to a filter circuit device, and a power converter including the filter circuit device, each used in an electric vehicle.

BACKGROUND ART

An electric automobile or a hybrid automobile is equipped with a power converter configured to drive a rotary electric machine for vehicle by using electric power of battery. The power converter for the electric automobile or the hybrid automobile needs to meet a strong requirement of miniaturization so as to secure space to be accommodated in the electric automobile or the hybrid automobile.

With the miniaturization of the power converter, along with components gathered closely together due to the miniaturization, noise propagation is expected to occur between the components and a countermeasure against the noise propagation is required. Thus, in some cases, provided is a filter device that includes a conductor including a core member, the conductor configured to transmit electric power (PTL 1).

However, as electrification of automobiles progresses rapidly, the power converter needs to meet further requirement for being miniaturized while maintaining or improving a noise suppression function.

CITATION LIST

Patent Literature

PTL 1: JP 2016-024939 A

SUMMARY OF INVENTION

Technical Problem

An object of the present invention is to provide a power converter that is miniaturized while maintaining or improving a noise suppression function.

Solution to Problem

A filter circuit device according to the present invention includes: a first core member configured to form a first through hole; a second core member configured to form a second through hole; a first conductor configured to pass through the first through hole and the second through hole; a second conductor configured to pass through the first through hole and the second through hole; a capacitor; a first terminal configured to electrically connect the first conductor with the capacitor; and a second terminal configured to electrically connect the second conductor with the capacitor. In the filter circuit device, the first conductor from the first through hole to the second through hole and the second conductor from the first through hole to the second through hole have an opposing part between the first conductor and the second conductor. The first terminal presses an opposite surface of the first conductor, the opposite surface opposite to an opposing surface of the first conductor, so as to be in contact with the first conductor. The second terminal presses an opposite surface of the second conductor, the opposite surface opposite to an opposing surface of the second conductor, so as to be in contact with the second conductor.

Advantageous Effects of Invention

The present invention provides a power converter that is miniaturized while maintaining or improving a noise suppression function.

DESCRIPTION OF EMBODIMENTS

An embodiment of a power converter according to the present invention will be described below with reference to the appended drawings. Note that, in each of the drawings, same constituent elements as those described in the others are denoted with the same reference signs, and a detailed description thereof will be omitted as appropriate. It is to be understood that the embodiment below is merely illustrative, and not restrictive, of the present invention; therefore, various modifications and applications in the technical concept may be made without departing from the scope of the present invention.

Figure 1:
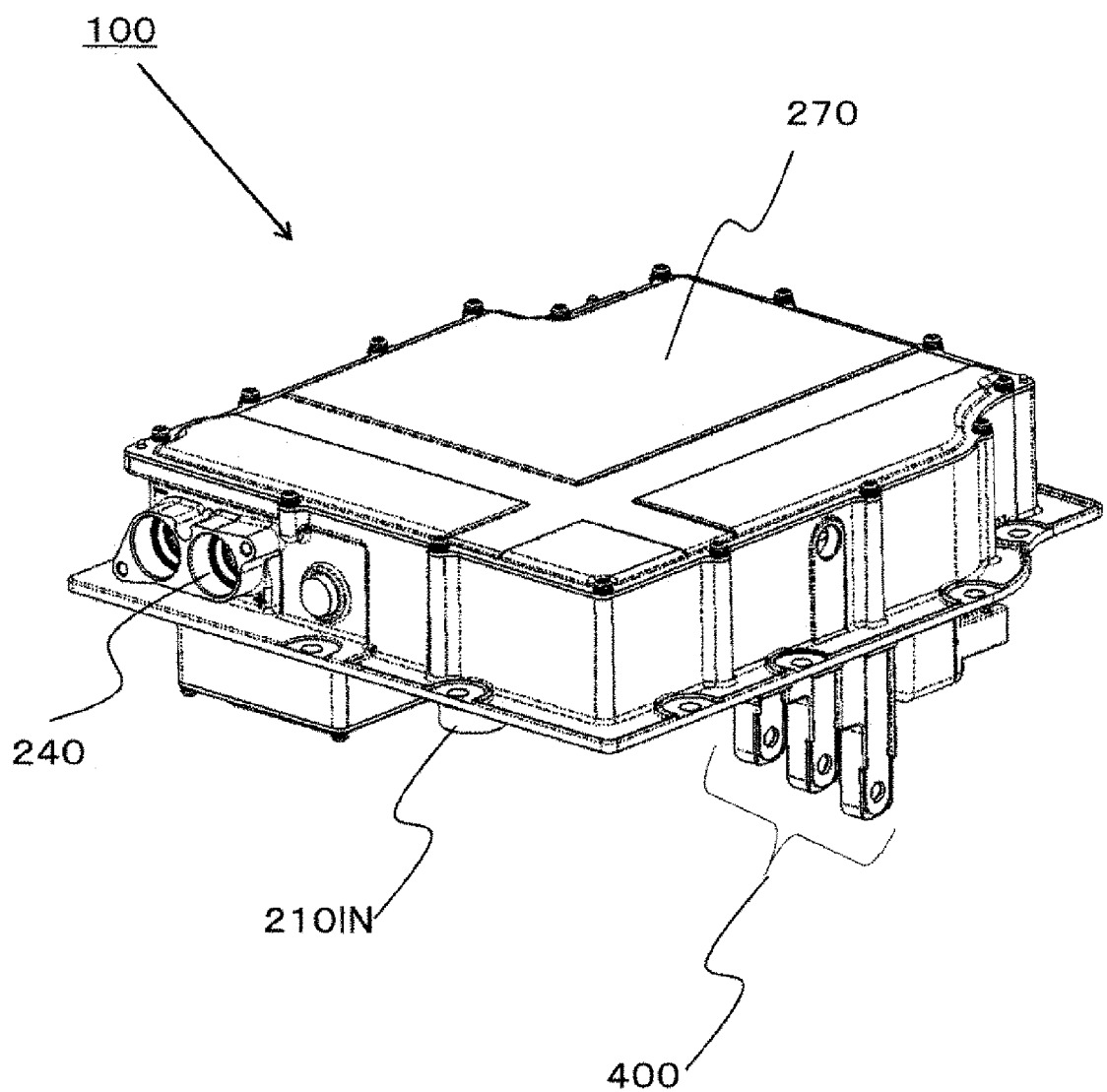
FIG. 1 is an external perspective view of a power converter 100 according to this embodiment.
Figure 2:
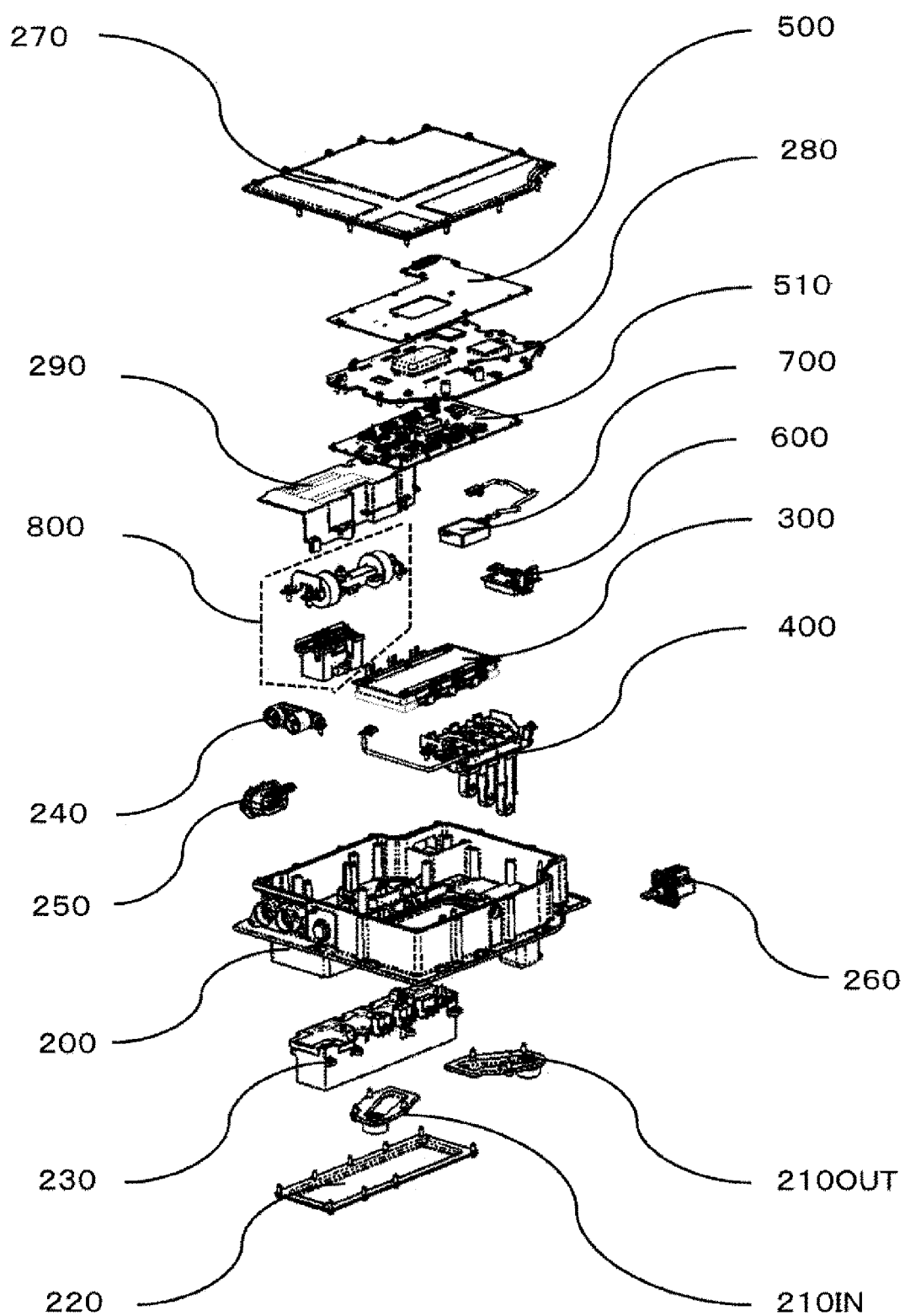
FIG. 2 is an exploded perspective view of the power converter 100 according to this embodiment.

FIG. 1 is an external perspective view of a power converter 100 according to this embodiment. FIG. 2 is an exploded perspective view of the power converter 100 according to this embodiment.

A power semiconductor module 300 includes a plurality of power semiconductor elements and is configured to convert DC power into AC power by switching operations of the power semiconductor elements. A capacitor module 230 is configured to smooth the DC power and supply the DC power smoothed to the power semiconductor module 300.

A high-power DC connector 240 is configured to transmit DC power from a battery to a filter circuit device 800 as will be described later. An AC conductor 400 is configured to supply the AC power to the motor.

A drive circuit board 510 is configured to calculate a drive signal for driving the power semiconductor element and output the drive signal to the power semiconductor module 300. A low-current signal connector 250 is configured to connect an integrated control circuit or the like with a control circuit board 500 to transmit/receive a control command signal or the like. The control circuit board 500 generates a control signal for controlling the drive circuit board 510 based on the control command signal, and outputs the control signal to the drive circuit board 510.

Between the control circuit board 500 and the drive circuit board 510, a metal base board 280 is disposed. The metal base board 280 is connected to a housing case 200 grounded. The metal base board 280 functions as a shielding plate for shielding noise generated from the power semiconductor module 300, the drive circuit board 510, and the like.

The housing case 200 has an excitation connector 260 connected thereto, and the excitation connector 260 is configured to transmit an excitation signal to an excitation circuit module 600.

In this embodiment, the housing case 200 includes a screw hole and thus, the excitation connector 260 is connected by a screw to the housing case 200, but may be connected in other methods.

The housing case 200 also has a filter circuit cover 290 connected thereto such that the filter circuit cover 290 covers the filter circuit device 800. The capacitor module 230 has an electrical charge accumulated therein and a discharge resistor 700 discharges the electrical discharge.

The housing case 200 accommodates the capacitor module 230 in one side space thereof (in a lower region of the power converter 100 in FIG. 2), and accommodates the other electrical circuit components described above in the other side space thereof (in an upper region of the power converter 100 in FIG. 2).

The housing case 200 has each of a refrigerant inflow pipe 210IN and a refrigerant outflow pipe 210OUT assembled thereto to cause refrigerant to flow in and out.

When the housing case 200 has accommodated each component, a lower housing case cover 220 and an upper housing case cover 270 are each assembled to the housing case 200.

Figure 3:
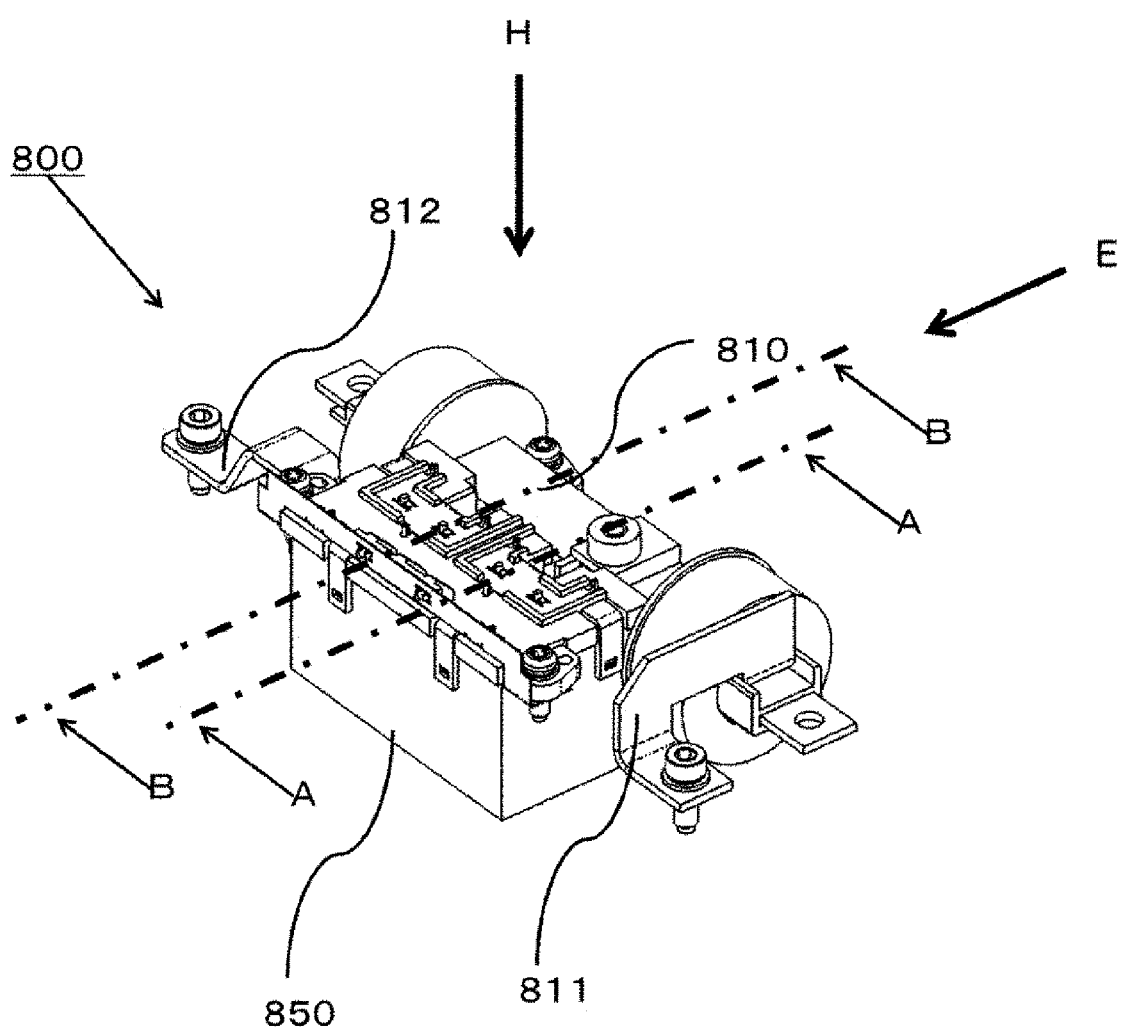
FIG. 3 is a perspective view of a filter circuit device 800 according to this embodiment.

FIG. 3 is a general perspective view of the filter circuit device 800 according to this embodiment.

Figure 4:
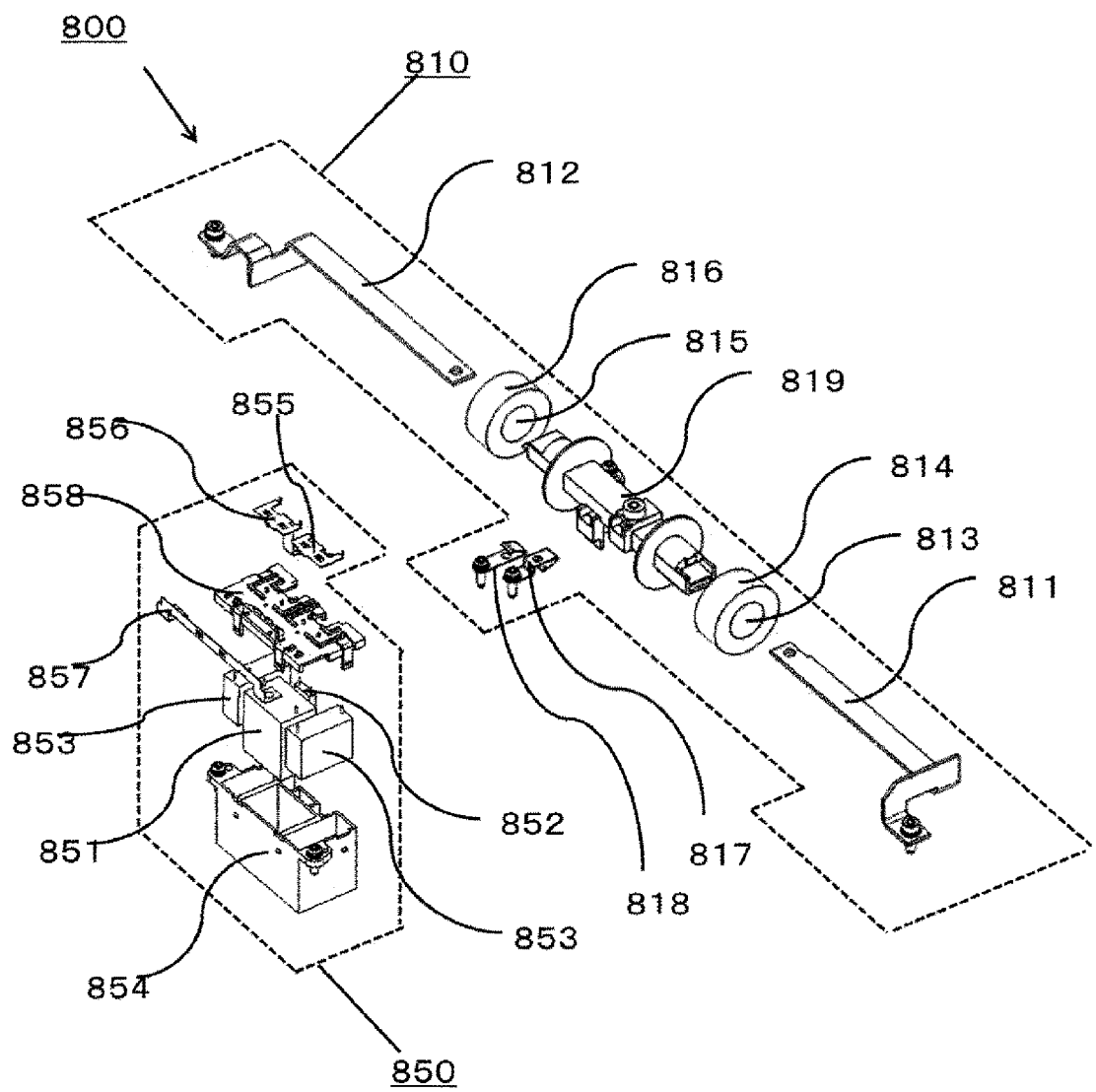
FIG. 4 is an exploded perspective view of the filter circuit device 800 according to this embodiment.

FIG. 4 is an exploded perspective view of the filter circuit device 800 according to this embodiment.

The filter circuit device 800 includes a DC conductor 810 and a capacitor circuit 850.

As illustrated in FIG. 4, the DC conductor 810 includes a first conductor 811, a second conductor 812, a first core member 814, a second core member 816, a first terminal 817, a second terminal 818, and a resin fixing part 819. The first core member 814 forms a first through hole 813, and the second core member 816 forms a second through hole 815. The first terminal 817 electrically connects the first conductor 811 with the capacitor circuit 850, and the second terminal 818 electrically connects the second conductor 812 with the capacitor circuit 850.

The first conductor 811 passes through each of the first through hole 813 and the second through hole 815. The second conductor 812 passes through each of the first through hole 813 and the second through hole 815.

The capacitor circuit 850 includes a first common mode capacitor 851, a second common mode capacitor 852, and two normal noise capacitors 853, all of which constitute a noise suppression unit. The capacitor circuit 850 includes a capacitor case 854 that forms space to accommodate each of the first common mode capacitor 851, the second common mode capacitor 852, and the two normal noise capacitors 853.

In this embodiment, the first common mode capacitor 851, the second common mode capacitor 852, and the two normal noise capacitors 853 are brought together to be accommodated in the capacitor case 854. Alternatively, the capacitor case 854 may be provided in a plurality of numbers, and the first common mode capacitor 851, the second common mode capacitor 852, and the two normal noise capacitors 853 may be divided to be accommodated in two or more of the capacitor cases 854. Still alternatively, the first common mode capacitor 851, the second common mode capacitor 852, and the two normal noise capacitors 853 may be brought together in other methods in addition to the capacitor case 854.

In the capacitor circuit 850, each of the first common mode capacitor 851, the second common mode capacitor 852, and the two normal noise capacitors 853 is electrically connected to the first terminal 817 via a first relay terminal 855. Similarly, each of the first common mode capacitor 851, the second common mode capacitor 852, and the two normal noise capacitors 853 is electrically connected to the second terminal 818 via a second relay terminal 856. The two normal noise capacitors 853 are grounded via a ground terminal 857.

The capacitor case 854 has an opening, and a capacitor cover 858 functions as a cover for the opening of the capacitor case 854.

In this embodiment, the capacitor circuit 850 includes two common mode capacitors: the first common mode capacitor 852 and the second common mode capacitor 853, each having a different capacitance from the other, but may alternatively include less than two common mode capacitors, or may include three or more common capacitors.

Figure 5:
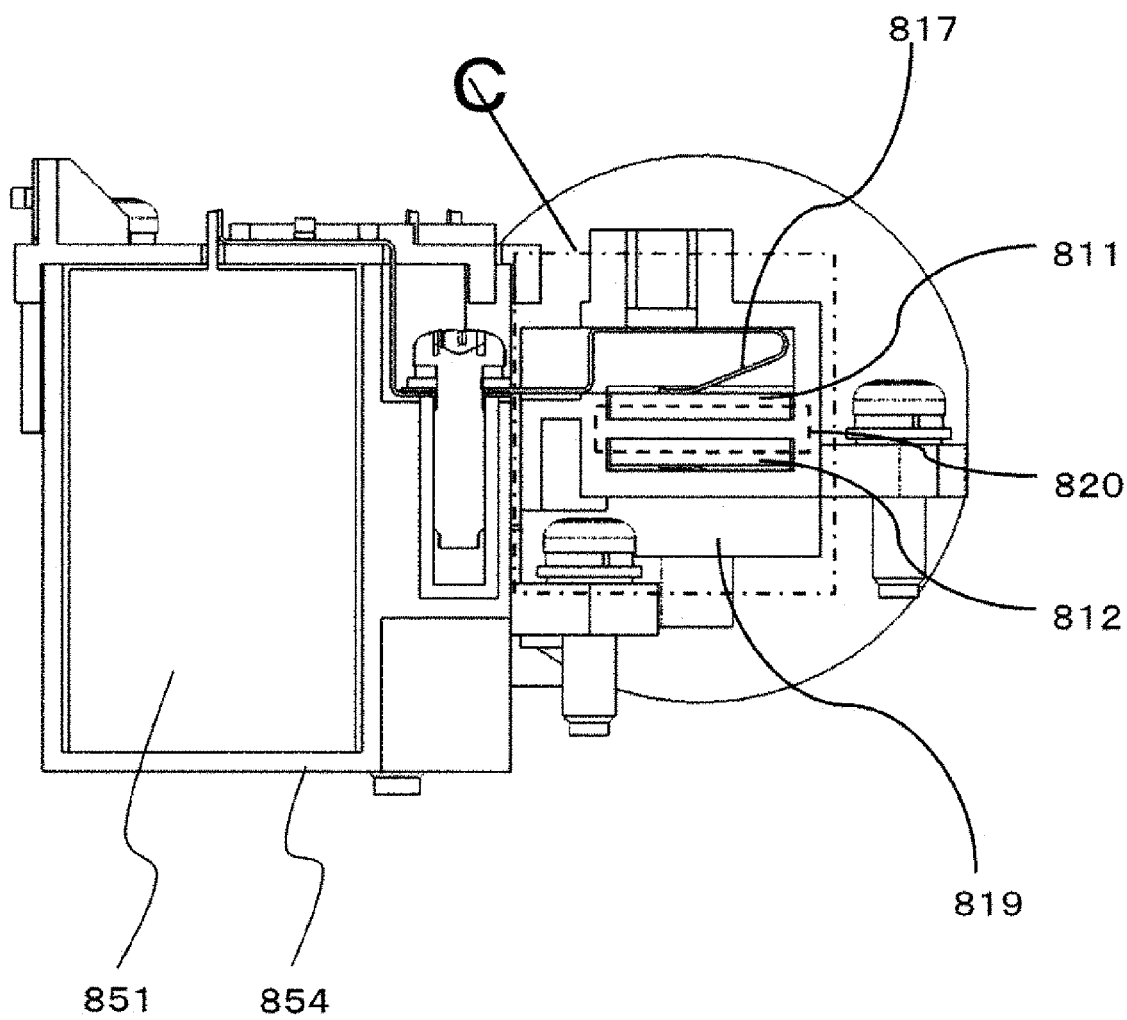
FIG. 5 is a cross-sectional view taken along a plane perpendicular to a face of the filter circuit device 800 including an arrow line A-A in FIG. 3.

FIG. 5 is a cross-sectional view taken along a plane perpendicular to a face of the filter circuit device 800 including an arrow line A-A in FIG. 3.

As illustrated in FIG. 5, each of the first conductor 811 and the second conductor 812 has a main surface and passes through the first through hole 813 and the second through hole 815. The main surface of the first conductor 811 and the main surface of the second conductor 812 oppose each other to form an opposing part 820. Here, the main surface of the first conductor 811 and the main surface of the second conductor 812 each represent a surface that is larger in area than the other surfaces thereof.

Figure 6:
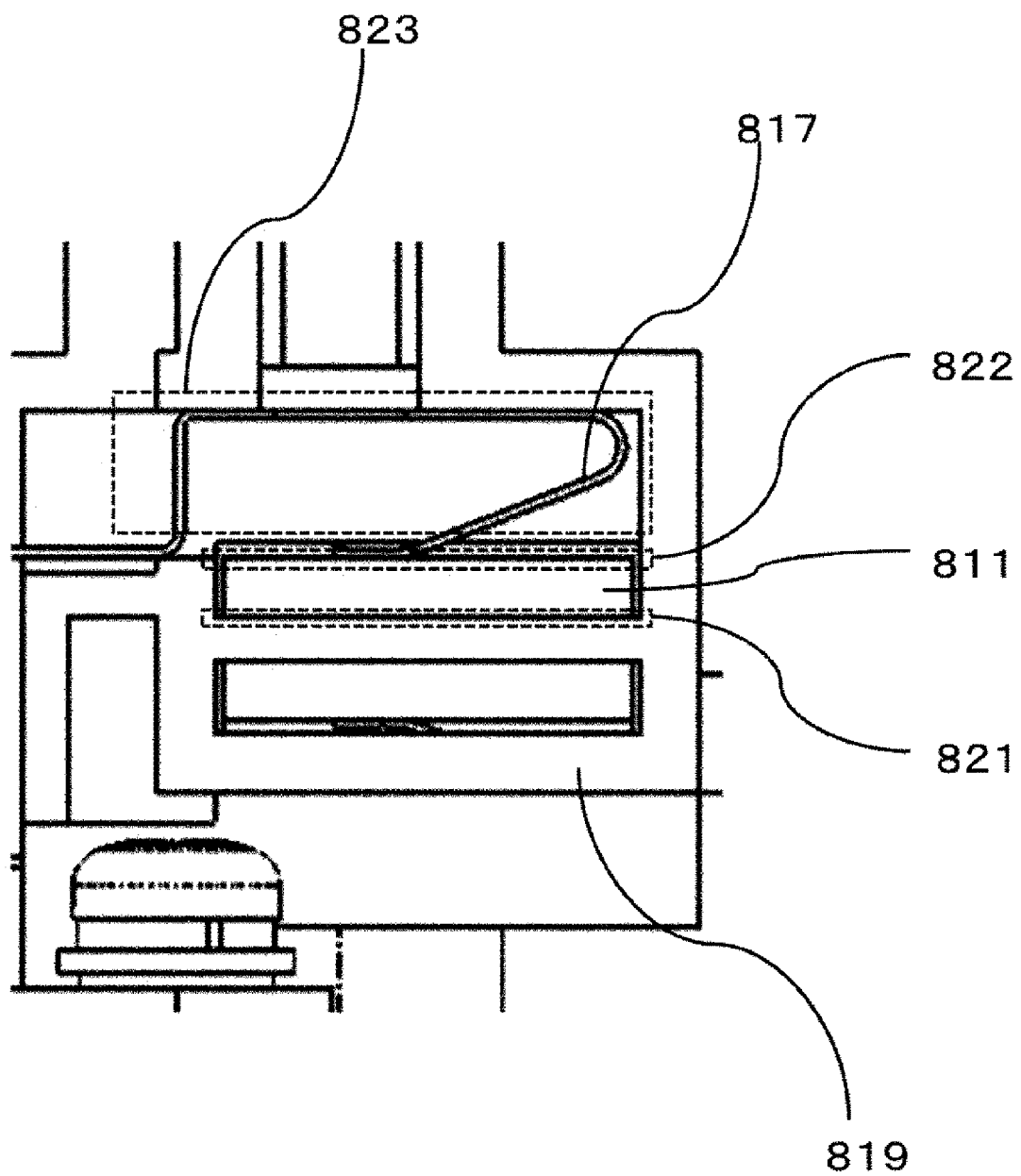
FIG. 6 is an enlarged view of a range C of the cross-sectional view of the filter circuit device 800 illustrated in FIG. 5.

FIG. 6 is an enlarged view of a range C of the cross-sectional view of the filter circuit device 800 illustrated in FIG. 5.

The first conductor 811 includes an opposing surface 821, and an opposite surface 822 that is opposite to the opposing surface 821. The first terminal 817 presses the opposite surface 822 of the first conductor 811 to be in contact with the first conductor 811.

In this embodiment, the first terminal 817 is a spring plate member, and is to be inserted into the resin fixing part 819 and an insertion space 823 for the first conductor 811. When the first terminal 817 is inserted into the insertion space 823, reaction force is generated. The reaction force causes the first terminal 817 to press the opposite surface 822 of the first conductor 811. The first terminal 817 may be caused to press the first conductor 811 by other means, such as other members.

Figure 7:
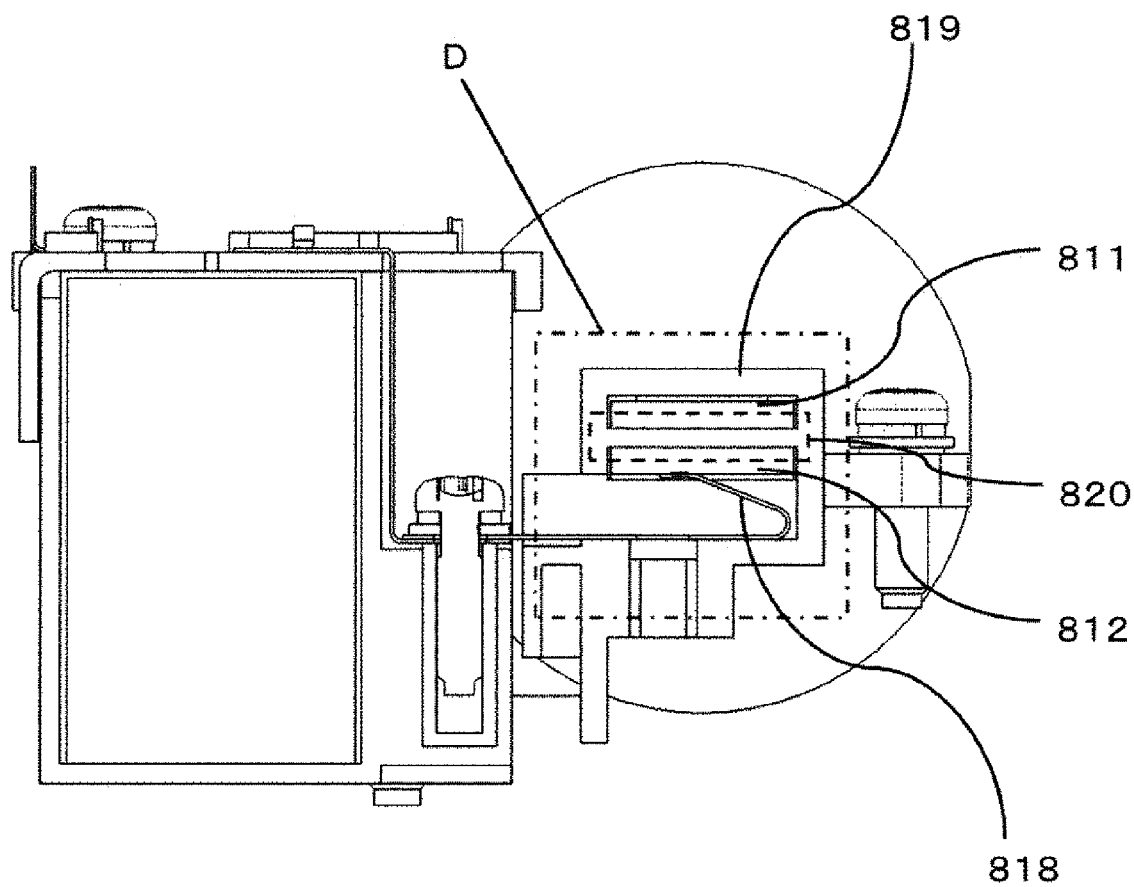
FIG. 7 is a cross-sectional view taken along a plane perpendicular to a face of the filter circuit device 800 including an arrow line B-B in FIG. 3.
Figure 8:
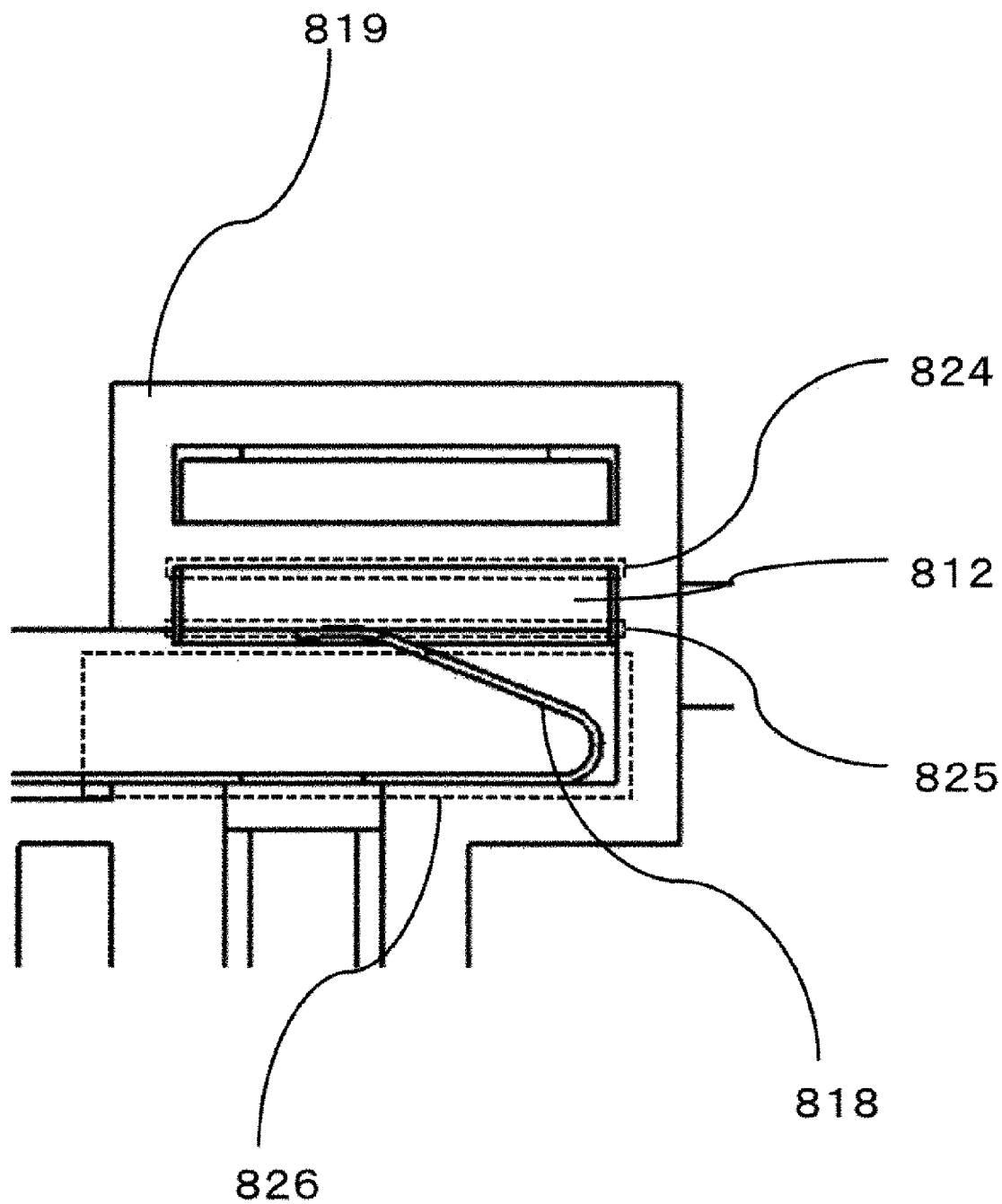
FIG. 8 is an enlarged view of a range D of the cross-sectional view of the filter circuit device 800 illustrated in FIG. 7.

FIG. 7 is a cross-sectional view taken along a plane perpendicular to a face of the filter circuit device 800 including an arrow line B-B in FIG. 3. FIG. 8 is an enlarged view of a range D of the cross-sectional view of the filter circuit device 800 illustrated in FIG. 7.

The second conductor 812 includes an opposing surface 824, and an opposite surface 825 that is opposite to the opposing surface 824. The second terminal 818 presses the opposite surface 825 of the second conductor 812 to be in contact with the second conductor 812.

In this embodiment, the second terminal 818 is a spring plate member, and is to be inserted into the resin fixing part 819 and an insertion space 826 for the second conductor 812. When the second terminal 818 is inserted into the insertion space 826, reaction force is generated. The reaction force causes the second terminal 818 to press the opposite surface 825 of the second conductor 812. The second terminal 818 may be caused to press the second conductor 812 by other means, such as other members.

Here, the principles of the invention according to this embodiment will be described. When electricity flows through a conductor such as the first conductor 811 or the second conductor 812, a magnetic field is generated around the conductor, and the magnetic field generates noise.

On the other hand, when the conductor penetrates a core of each of the first core member 814 and the second core member 816, the core constitutes an inductor. The inductor has an impedance that rises with respect to a high frequency component. Thus, a high frequency noise component is less prone to pass through the inductor, and thus the inductor has performance as a low pass filter.

In this embodiment, each of the first conductor 811 and the second conductor 812 penetrates the first core member 814 and the second core member 816. In other words, each of the first core member 814 and the second core member 816 has double noise filters formed therein. This configuration improves performance of removing the noise.

A power converter needs to meet requests of weight reduction, miniaturization, and cost reduction. Accordingly, a noise filter accommodated in the power converter is required to be light-weight/small-size and low-cost while having a high capability to remove the noise.

This embodiment employs a small-size core while securing the capability to remove the noise. Concurrently, this embodiment employs, as a conductor penetrating the core, an item to which no large fastening component, e.g., a large stud, is assembled. An object of preventing the large stud or the like assembled is to prevent an increase in weight, space, or cost due to an increase in the number of components. Additionally, less number of components may lead to a reduction in the number of assembly processes, and further to assembly efficiency improvement and cost reduction.

In addition to using the core, a capacitor may function as another means for removing the noise. The capacitor has an impedance that rises with respect to a low frequency component. Thus, a low frequency noise component is less prone to pass the capacitor, and thus the capacitor has performance as a high pass filter. In this embodiment, a plurality of capacitors having different capacities are used to improve the performance of removing the noise in each given low-frequency band.

Pressing may function as a means for connecting the conductors to each other. The first conductor 811 and the second conductor 812 have the opposing part 820 between the first conductor 811 and the second conductor 812. Each of the first terminal 817 and the second terminal 818 is caused to press the corresponding opposite surface that is opposite to the opposing part 820 (the first terminal 817 presses the opposite surface 822 of the first conductor 811, and the second terminal 818 presses the opposite surface 825 of the second conductor 812).

Accordingly, in this embodiment, even with a structure where a non-divided type of core is used, the capability to remove the noise is not degraded, and the less number of components may lead to the weight reduction, the miniaturization, the cost reduction, and the assembly efficiency improvement.

Figure 9:
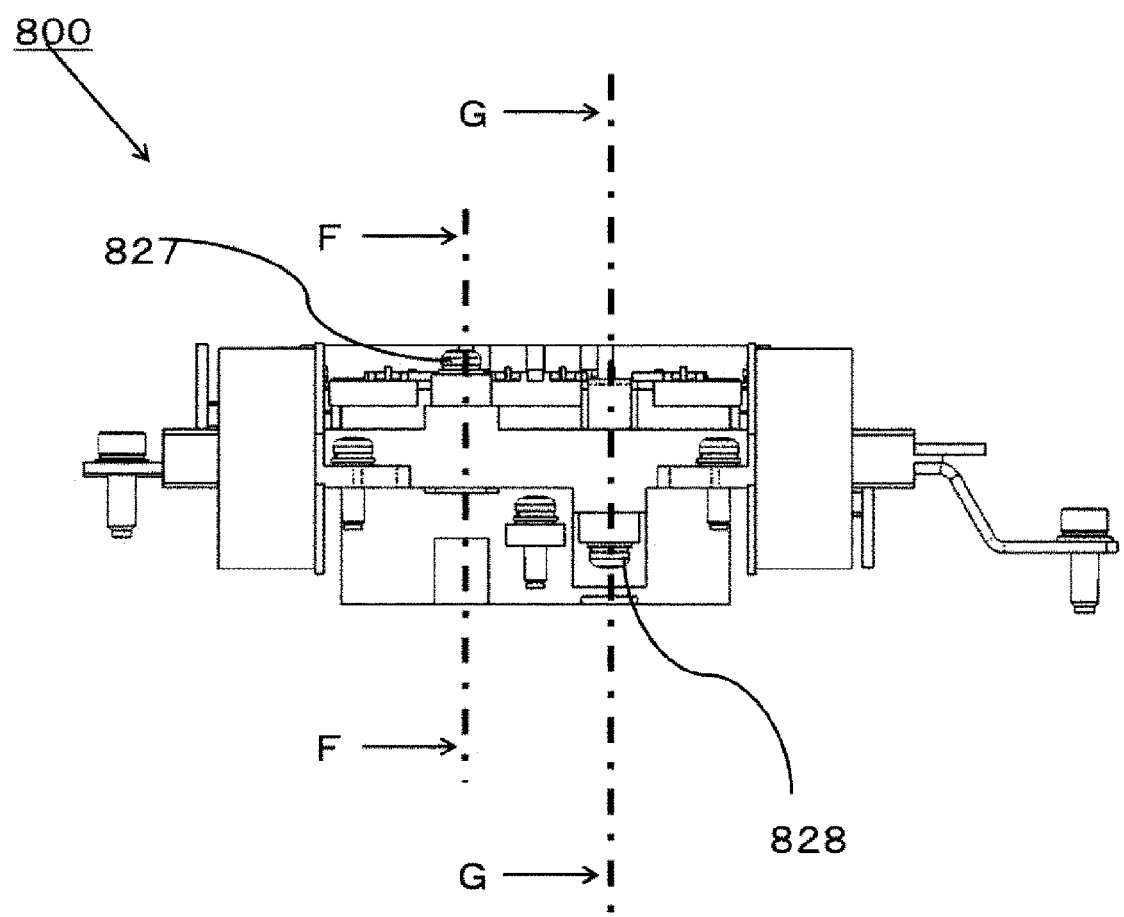
FIG. 9 is a rear view of the filter circuit device 800, the view on arrow E in FIG. 3.
Figure 10:
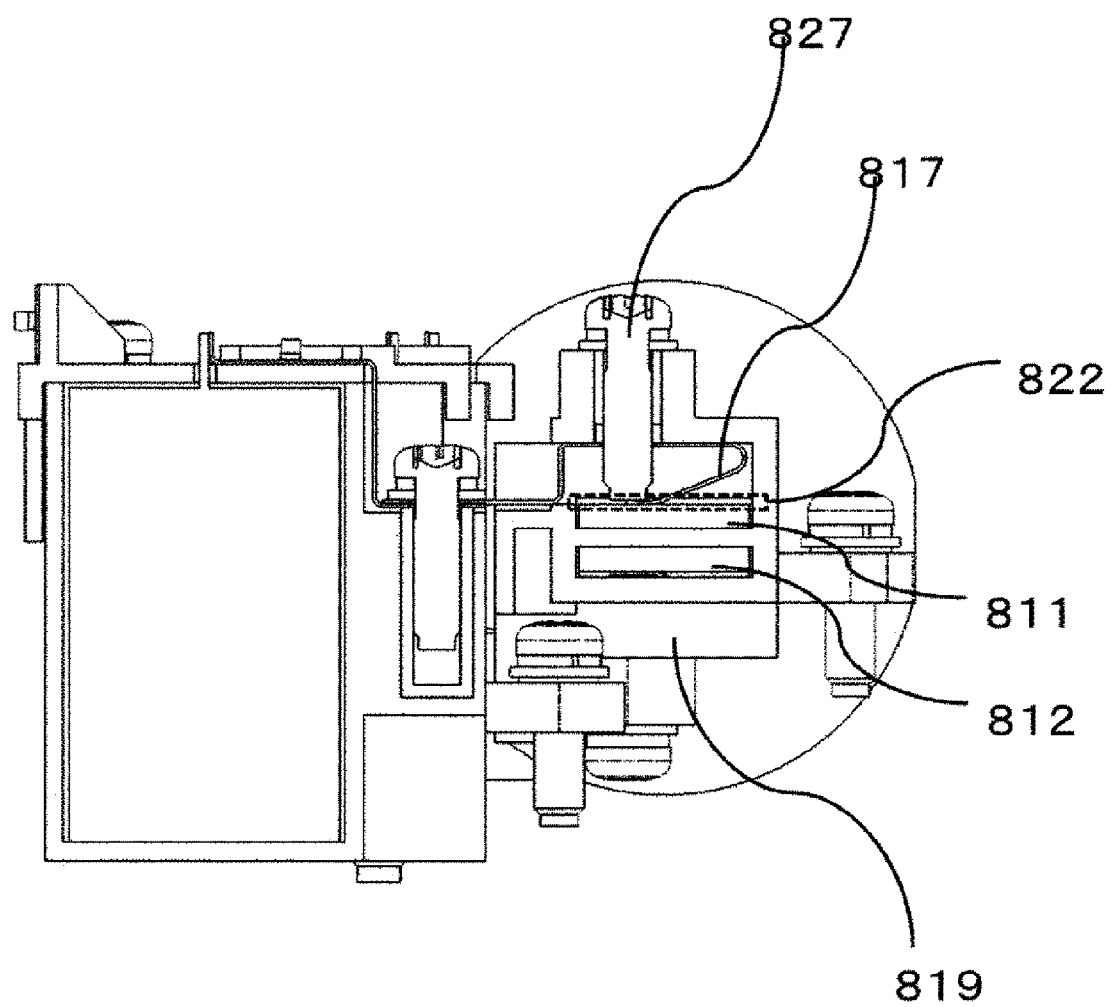
FIG. 10 is a cross-sectional view taken along a plane perpendicular to a face of the filter circuit device 800 including an arrow line F-F in FIG. 9.
Figure 11:
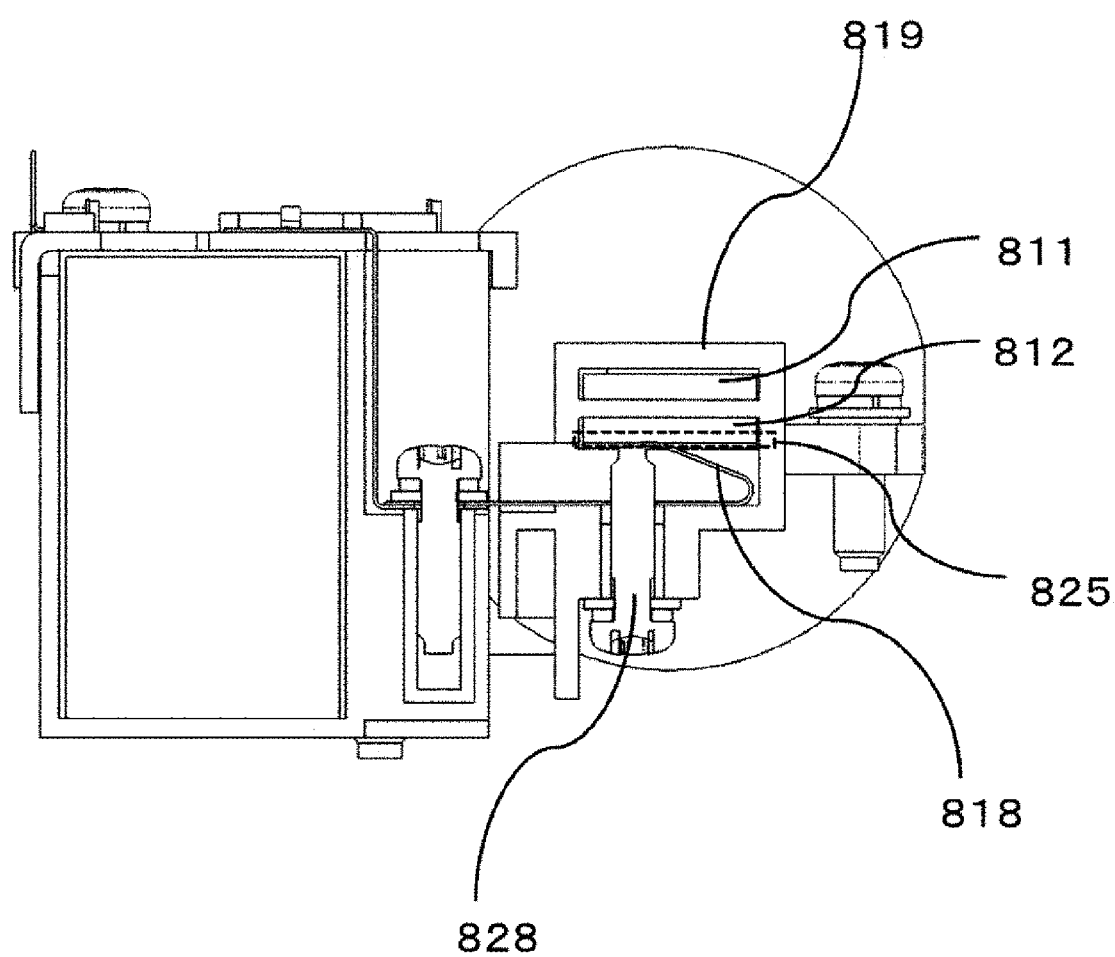
FIG. 11 is a cross-sectional view taken along a plane perpendicular to a face of the filter circuit device 800 including an arrow line G-G in FIG. 9.

FIG. 9 is a rear view of the filter circuit device 800, the view on arrow E in FIG. 3. FIG. 10 is a cross-sectional view taken along a plane perpendicular to a face of the filter circuit device 800 including an arrow line F-F in FIG. 9. FIG. 11 is a cross-sectional view taken along a plane perpendicular to a face of the filter circuit device 800 including an arrow line G-G in FIG. 9.

As illustrated in FIG. 10, the first terminal 817 is pressed by a first pressing member 827 to the opposite surface 822 of the first conductor 811. As illustrated in FIG. 11, similarly to the first terminal 817, the second terminal 818 is pressed by a second pressing member 828 to the opposite surface 825 of the second conductor 818.

Each of the first pressing member 827 and the second pressing member 828 is, for example, a screw mechanism, but may be any other member capable of pressing the first terminal 817 and the second conductor 818.

Figure 12:
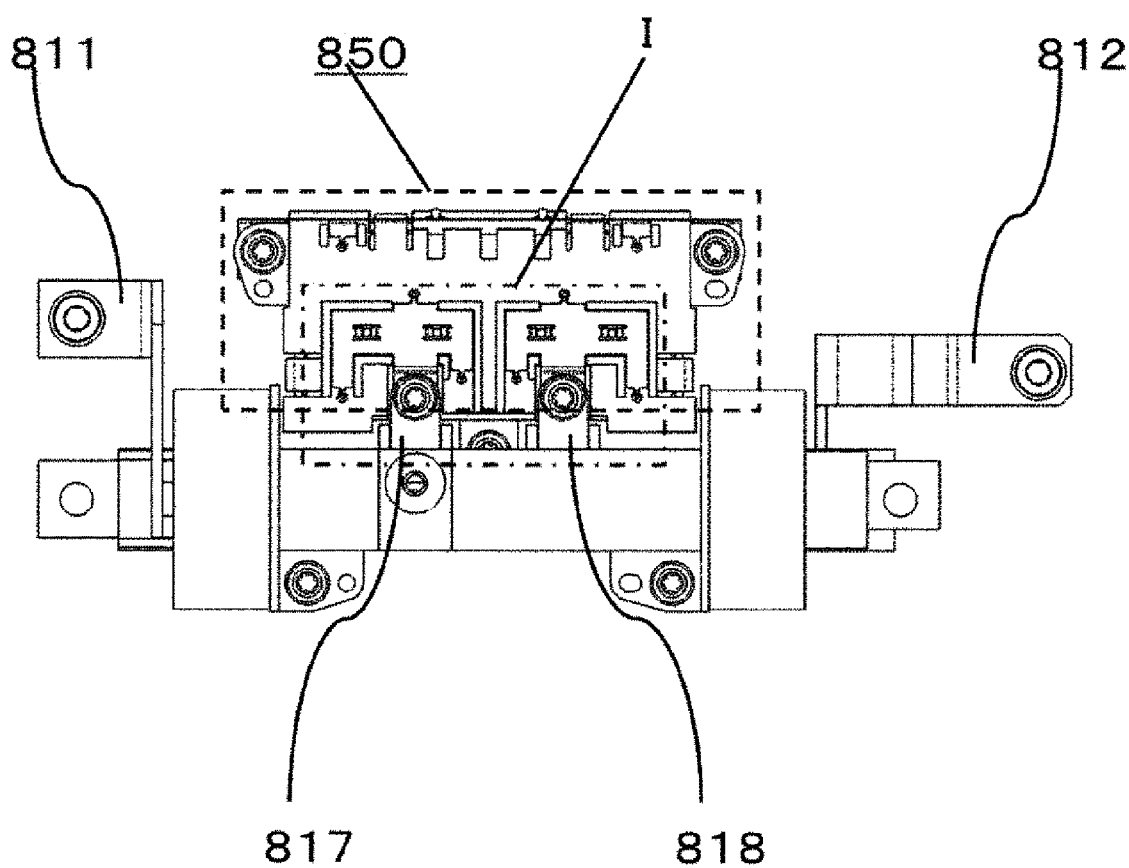
FIG. 12 is a top view of the filter circuit device 800, the view on arrow H in FIG. 3.

FIG. 12 is a top view of the filter circuit device 800, the view on arrow H in FIG. 3. FIG. 12 is also a view of the filter circuit device 800 when seen from a direction perpendicular to the opposing surface 821 of the first conductor 811.

As illustrated in FIG. 12, the first terminal 817 and the second terminal 818 are positioned not to overlap each other, and the capacitor circuit 850 is positioned to have its part sandwiched between the first terminal 817 and the second terminal 818.

As a means for reducing the number of assembly processes and improving the assembly efficiency, screws of the first pressing member 827 and the second pressing member 828 may be designed to be inserted in the same direction.

In this embodiment, the filter circuit device 800 is configured to be inserted into the housing case of the power converter in a direction perpendicular to the opposing surface 821 before fastened with screws. With this configuration, it is possible to screw-fasten the housing case without changing an orientation of the housing case, and thus to improve the assembly efficiency.

Further, as a means for saving space for arranging components, dead space may be reduced. In this embodiment, the housing case has limited space to accommodate the filter circuit device 800, and each of capacitors to be used is restricted in dimension. Accordingly, the capacitor circuit 850 is required to have as little dead space as possible.

As illustrated in FIG. 12, the capacitor circuit 850 is inserted into the dead space between the first core member 814 and the second core member 816, and concurrently, the capacitor circuit 850 is disposed in the position sandwiched between the first terminal 817 and the second terminal 818. As a result, the dead space is reduced.

Figure 13:
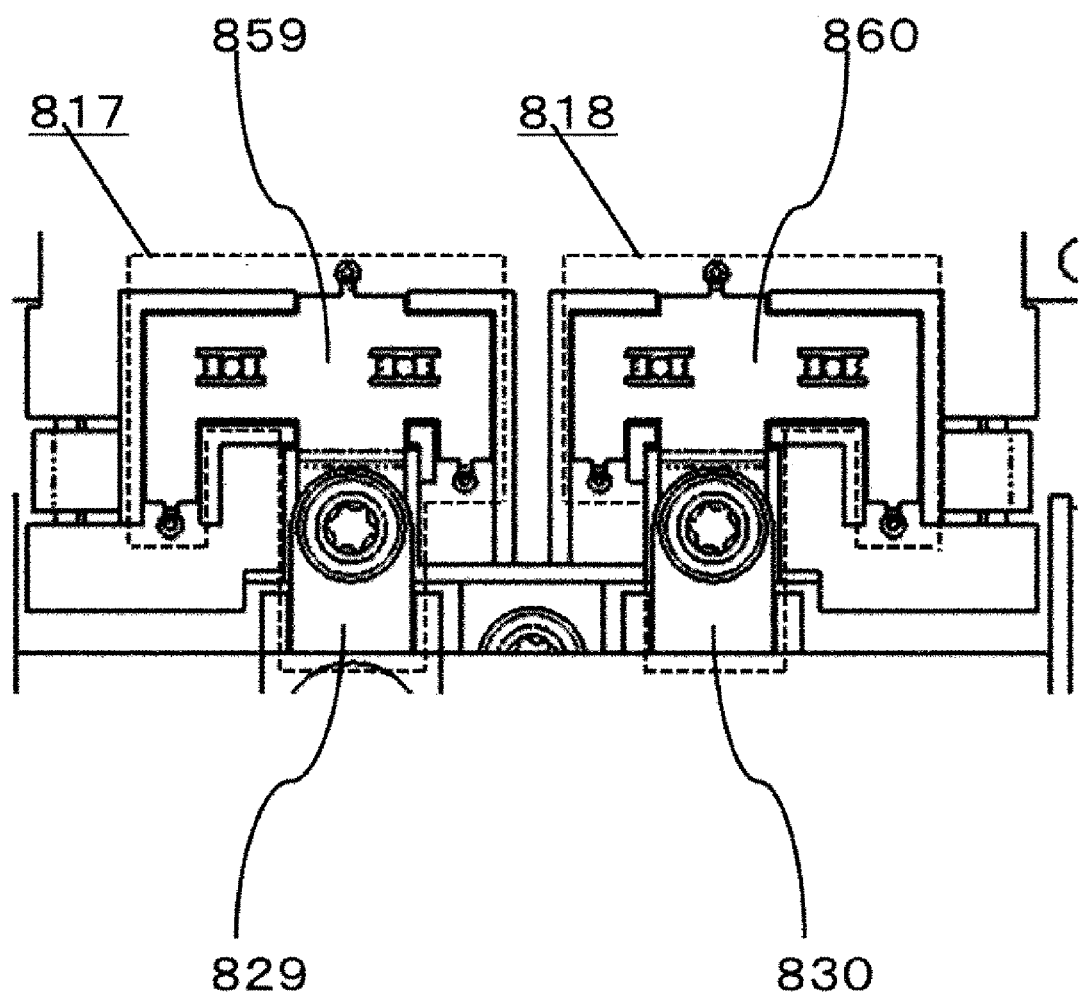
FIG. 13 is a partial enlarged view of a range I of the filter circuit device 800 illustrated in FIG. 12.

FIG. 13 is a partial enlarged view of a range I of the filter circuit device 800 illustrated in FIG. 12.

In the embodiment, the capacitors to be used are brought together in the capacitor circuit 850, and each of the terminals for these capacitors is a cylindrical lead wire type. In order to be easily and electrically connected to these capacitors, the terminals for the capacitors may be welded or soldered to the capacitors. In this state, the capacitor circuit 850 needs to be configured to prevent these welded or soldered parts from being cracked by external force. Thus, in this embodiment, at assembly of the capacitor circuit 850, a first capacitor-side terminal 859 and a second capacitor-side terminal 860 are built in the capacitor circuit 850 before welded or soldered to the capacitors. With this configuration, the terminals, each welded or soldered, are securely and electrically connected to the capacitors and the welded or soldered parts are less exposed to the external force.

The first terminal 817 includes the first capacitor-side terminal 859 and a first conductor-side terminal 829. The first capacitor-side terminal 859 is provided at a side closer to the first capacitor. The first conductor-side terminal 829 is a different member from the first capacitor-side terminal 859 and is in contact with the first conductor 811.

The second terminal 818 includes the second capacitor-side terminal 860 and a second conductor-side terminal 830. The second capacitor-side terminal 860 is provided at a side closer to the second capacitor. The second conductor-side terminal 830 is a different member from the second capacitor-side terminal 860 and is in contact with the second conductor 812.

Figure 14:
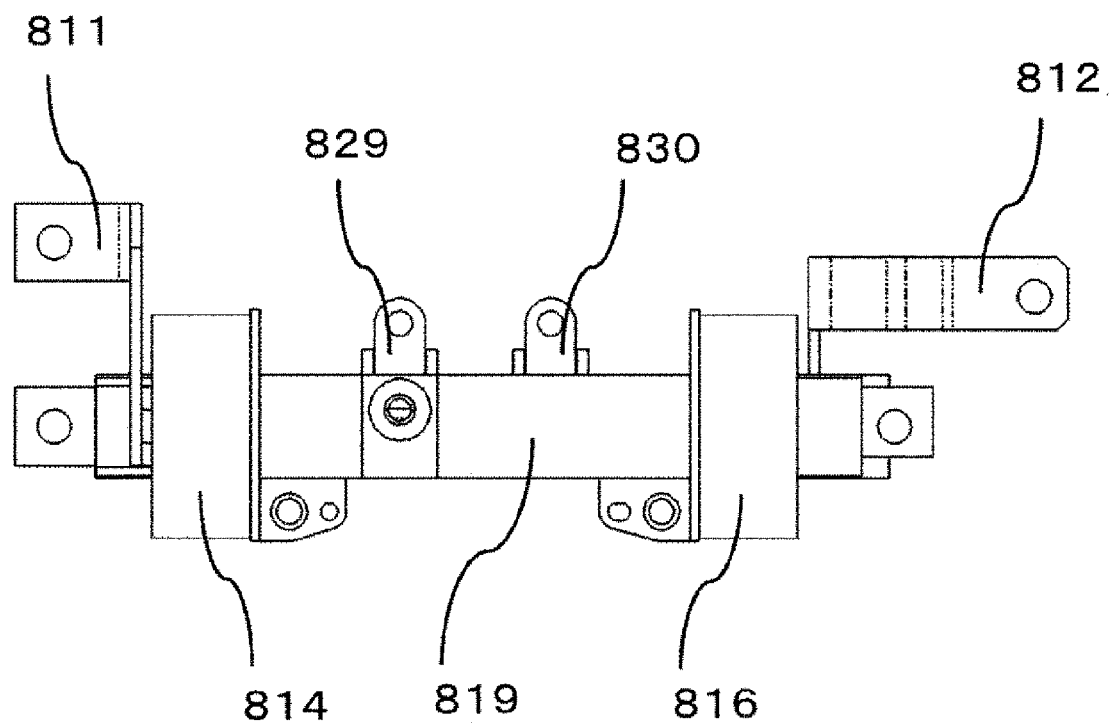
FIG. 14 is a front view of a state where a first core member 814, a second core member 816, and a DC conductor 810 are assembled.

FIG. 14 is a front view of a state where the first core member 814, the second core member 816, and the DC conductor 810 are assembled.

The resin fixing part 819 supports the first core member 814, the second core member 816, the first conductor 811, the second conductor 812, the first conductor-side terminal 829, and the second conductor-side terminal 830.

With this configuration, each component is brought together to be a single sub-assembly, thereby resulting in the assembly efficiency improvement. The resin fixing part 819 also acts to insulate and prevent a short circuit between the first conductor 811, the second conductor 812, the first conductor-side terminal 829, and the second conductor-side terminal 830, through each of which current flows.

REFERENCE SIGNS LIST

100 power converter
200 housing case
210IN refrigerant inflow pipe
210OUT refrigerant outflow pipe
230 capacitor module
240 high-power DC connector
250 low-current signal connector
260 excitation connector
280 metal base board
290 filter circuit cover
300 power semiconductor module
400 AC conductor
500 control circuit board
510 drive circuit board
700 discharge resistor
800 filter circuit device
810 DC conductor
811 first conductor
812 second conductor
813 first through hole
814 first core member
815 second through hole
816 second core member
817 first terminal
818 second terminal
819 resin fixing part
820 opposing part
821 opposing surface
822 opposite surface
823 insertion space
825 opposite surface
826 insertion space
827 first pressing member
828 second pressing member
829 first conductor-side terminal
830 second conductor-side terminal
850 capacitor circuit
851 first common mode capacitor
852 second common mode capacitor
853 normal noise capacitor
854 capacitor case
855 first relay terminal
856 second relay terminal
857 ground terminal
858 capacitor cover
859 first capacitor-side terminal
860 second capacitor-side terminal

The invention claimed is:

1. A filter circuit device comprising:
a first core member configured to form a first through hole;
a second core member configured to form a second through hole;
a first conductor configured to pass through the first through hole and the second through hole;
a second conductor configured to pass through the first through hole and the second through hole;
a capacitor;
a first terminal configured to electrically connect the first conductor with the capacitor; and
a second terminal configured to electrically connect the second conductor with the capacitor,
wherein
the first conductor from the first through hole to the second through hole and the second conductor from the first through hole to the second through hole have an opposing part between the first conductor and the second conductor,
the first terminal presses an opposite surface of the first conductor, the opposite surface opposite to an opposing surface of the first conductor, in order to be in contact with the first conductor, and
the second terminal presses an opposite surface of the second conductor, the opposite surface opposite to an opposing surface of the second conductor, in order to be in contact with the second conductor.

2. The filter circuit device according to claim 1, further comprising:
a first pressing member configured to press the first terminal to the first conductor; and
a second pressing member configured to press the second terminal to the second conductor.

3. The filter circuit device according to claim 1, wherein when seen from a direction perpendicular to the opposing surface of the first conductor, the first terminal and the second terminal are disposed where the first terminal and the second terminal do not to overlap each other, and the capacitor is disposed where the capacitor is sandwiched between the first terminal and the second terminal.

4. The filter circuit device according to claim 1, wherein the first terminal includes: a first capacitor-side terminal that is provided at a side closer to the capacitor; and a first conductor-side terminal that is formed of a different member from the first capacitor-side terminal and is in contact with the first conductor, and the second terminal includes: a second capacitor-side terminal that is provided at a side closer to the capacitor; and a second conductor-side terminal that is formed of a different member from the second capacitor-side terminal and is in contact with the second conductor.

5. The filter circuit device according to claim 4, further comprising a resin fixing part configured to support the first core member, the second core member, the first conductor, the second conductor, the first conductor-side terminal, and the second conductor-side terminal.

6. A power converter including the filter circuit device according to claim 1, the power converter comprising:

a power semiconductor module configured to convert DC power into AC power; and a capacitor module configured to smooth the DC power, wherein the filter circuit device removes noise of the DC power supplied to the capacitor module.

7. The power converter according to claim 6, further comprising:

a housing configured to form space for accommodating the power semiconductor module and the filter circuit device; and a cover configured to be disposed in space between the power semiconductor module and the filter circuit device and configured to be connected to the housing.

* * * * *